(12) United States Patent  
Hossain et al.

(10) Patent No.: US 8,683,096 B2  
(45) Date of Patent: Mar. 25, 2014

(54) CONFIGURATION OF DATA STROBES

(75) Inventors: Md Altaf Hossain, Portland, OR (US);  
Kevin J. Doran, North Plains, OR (US);  
Nagi Aboulenein, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 79 days.

(21) Appl. No.: 13/535,278

(22) Filed: Jun. 27, 2012

(65) Prior Publication Data

US 2014/0003169 A1  Jan. 2, 2014

(51) Int. Cl.  
*G06F 3/00* (2006.01)

(52) U.S. Cl.  
USPC ............ 710/32; 710/107; 713/320; 713/324

(58) Field of Classification Search  
USPC .............................. 710/32, 107; 713/320, 324  
See application file for complete search history.

(56) References Cited

U.S. PATENT DOCUMENTS

2007/0033313 A1* 2/2007 Gaskins ................. 710/117  
2012/0069687 A1* 3/2012 Koshizuka ............. 365/193

* cited by examiner

*Primary Examiner* — Hoai V Ho  
(74) *Attorney, Agent, or Firm* — Schwabe, Williamson & Wyatt, P.C.

(57) ABSTRACT

Disclosed embodiments may include a circuit having a plurality of data terminals, no more than two pairs of differential data strobe terminals associated with the plurality of data terminals, and digital logic circuitry. The digital logic circuitry may be coupled to the data terminals and configured to use the no more than two pairs of differential data strobe terminals concurrently with the plurality of data terminals to transfer data. Other embodiments may be disclosed.

22 Claims, 4 Drawing Sheets

CONFIGURATION OF DATA STROBES

TECHNICAL FIELD

Embodiments of the present disclosure relate generally to a configuration of data strobes.

BACKGROUND INFORMATION

Memory controllers may communicate with memory through a variety of synchronous signals, such as clock signals, data signals, address signals, and strobe signals. Each signal may occupy a dedicated terminal in the memory controller and memory device. Each signal may also be transferred between the memory controller and the memory device by a dedicated circuit board trace. Each dedicated terminal and circuit board trace consumes silicon real estate or otherwise places constraints on the minimize size of the system, due to trace routing.

BRIEF DESCRIPTION OF THE DRAWINGS

Embodiments of the invention are illustrated by way of example, and not by way of limitation, in the figures of the accompanying drawings in which like reference numerals refer to similar elements.

DESCRIPTION OF THE EMBODIMENTS

Embodiments of the present disclosure may relate to configurations of data strobe lines and/or terminals. According to one embodiment, a memory controller or a double data rate dynamic random access memory (DDR DRAM) memory device may have a plurality of data terminals and a plurality of differential strobe terminals. In embodiments, the memory controller and the DDR DRAM memory device may include no more than two pairs of strobe terminals for every 64 data terminals. According to another embodiment, the memory controller may be configured to selectively reduce use of all available data strobe lines and/or terminals. Less data strobes may advantageously enable size reduction of a memory controller, a memory device, and an interconnecting printed circuit board that couples the memory controller to the memory device.

Various aspects of the illustrative embodiments will be described using terms commonly employed by those skilled in the art to convey the substance of their work to others skilled in the art. It will be apparent to those skilled in the art, however, that some alternate embodiments may be practiced using portions of the described aspects. For purposes of explanation, specific numbers, materials, and configurations are set forth in order to provide a thorough understanding of the illustrative embodiments. It will be apparent to one skilled in the art, however, that alternate embodiments may be practiced without the specific details. In other instances, well-known features are omitted or simplified in order to not obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(B) or (A B)", that is, A is optional.

Figure 1:
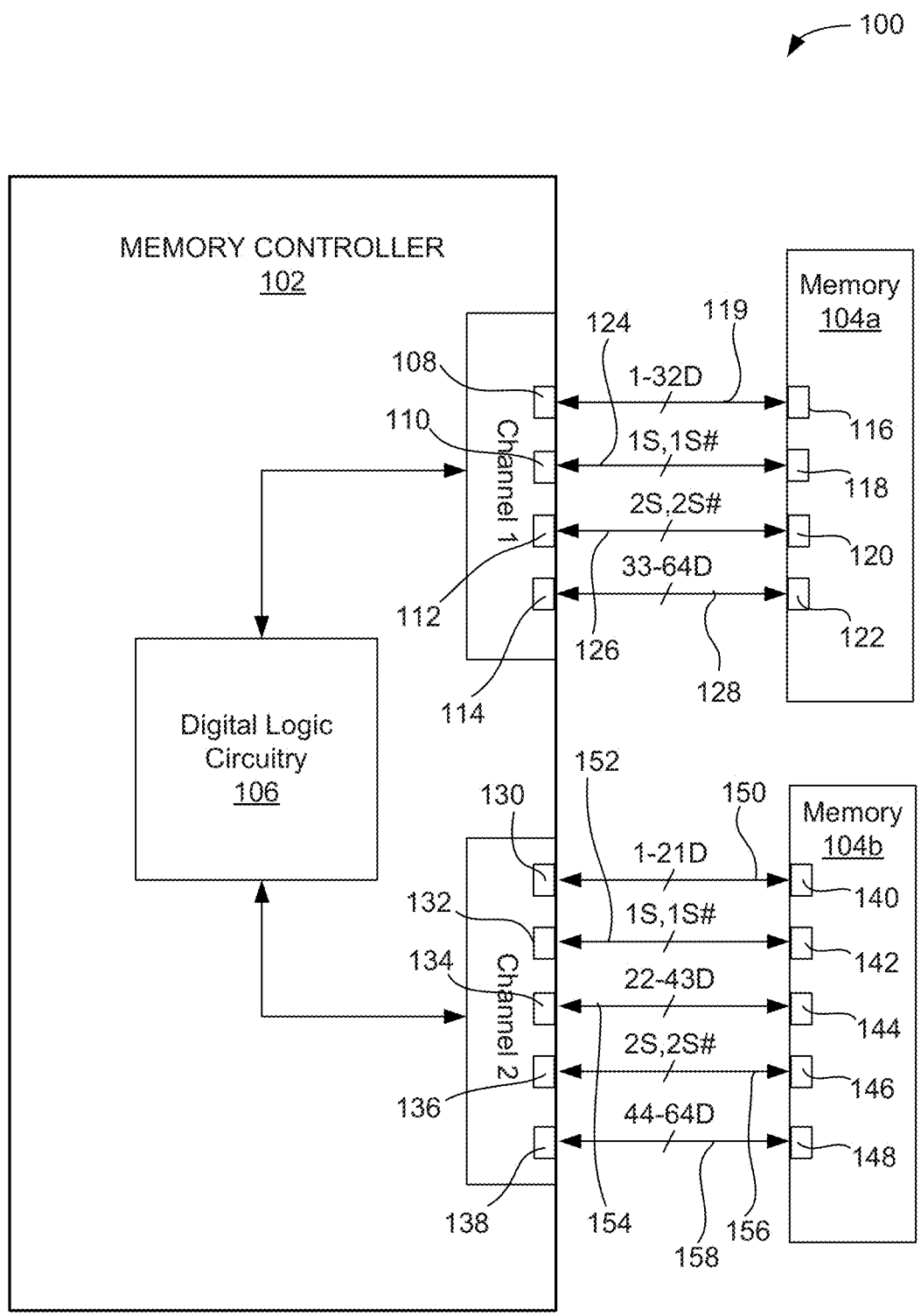
FIG. 1 describes a block diagram of a computing system including a memory controller, according to various embodiments of the present disclosure.

FIG. 1 illustrates a computing system 100 suitable for practicing embodiments of the present disclosure. Computing system 100 may include a memory controller 102 configured to transmit various synchronous signals to memory 104*a* and 104*b* (collectively 104).

Memory controller 102 may be configured to provide various data and control signals to memory 104. Memory controller 102 may include digital logic circuitry 106, a first communication channel, i.e., Channel 1, and a second communication channel, i.e., Channel 2. Digital logic circuitry 106 may be configured to transfer data and control signals to and from Channel 1 and Channel 2.

Channel 1 may be configured to communicate data to memory 104*a* through a number of conductive terminals and conductive lines. Channel 1 may include a number of data terminals 108, a number of data strobe terminals 110, a number of data strobe terminals 112, and a number of data terminals 114. Memory 104*a* may include a number of data terminals 116, a number of data strobe terminals 118, a number of data strobe terminals 120, and a number of data terminals 122. Data terminals 108 may be communicatively coupled to data terminals 116 via a data bus 119. Data bus 119 may be configured to carry signals for data lines 1-32D between memory controller 102 and memory 104*a*. Data strobe terminals 110 may be communicatively coupled to data strobe terminals 118 via a data strobe bus 124. Data strobe bus 124 may be configured to carry differential strobe signals for a differential data strobe signal pair 1S, 1S# (hereinafter, data strobe pair 1S, 1S#). Data strobe terminals 112 may be communicatively coupled to data strobe terminals 120 via a data strobe bus 126. Data strobe bus 126 may be configured to carry differential data signals for a differential data strobe signal pair 2S, 2S# (hereinafter, data strobe pair 2S, 2S#). Data terminals 114 may be communicatively coupled to data terminals 122 via data bus 128. Data bus 128 may be configured to carry signals for data lines 33-64D between memory controller 102 and memory 104*a*.

According to embodiments, memory controller 102 may include data strobe terminals 110 and data strobe terminals 112 to accommodate data strobe pair 1S, 1S# and data strobe pair 2S, 2S#, without any additional data strobe pair terminals in Channel 1. In embodiments, computer system 100 may include data strobe bus 124 and data strobe bus 126 without any additional data strobe buses associated with Channel 1. According to other embodiments, data strobe pair 1S, 1S# and data strobe pair 2S, 2S# may be positioned or disposed in between data bus 119 and data bus 128. For example, data strobe pair 1S, 1S# and data strobe pair 2S, 2S# may be disposed or positioned at or near a center of data bus 119 and data bus 128.

Traditional techniques used to interface a memory controller with DDR DRAM include the use of one pair of data strobe lines for every 4 data lines or for every 8 data lines. Thus, using traditional techniques, a computing system manufacturer may use 8 or 16 pairs of differential data strobe lines for every 64 data lines. In accordance with embodiments of the present disclosure, computing system 100 may reduce the number of strobe lines or strobe pairs to a one-fourth or one-eighth of the number of strobe lines or strobe pairs traditionally used.

The configuration of computing system 100 offers many advantages over traditional data strobe pair configurations between a memory controller and memory, e.g., DDR DRAM. For example, by using data strobe pair 1S, 1S# and data strobe pair 2S, 2S# without additional data strobe pairs in Channel 1, computing system 100 may decrease power consumption by 0.25 watts. Thus, if the configuration of Channel 1 is also used for Channel 2, computing system 100 may decrease power consumption by 0.5 watts over traditional data strobe pair configurations. Furthermore, employing data strobe pair 1S, 1S# and data strobe pair 2S, 2S# without additional data strobe pairs in Channel 1, 12-16 data strobe terminals may be omitted in the design of memory controller 102 as well as from memory 104a to provide a decrease in used silicon real estate. With the decrease in silicon real estate, memory controller 102 and memory 104a may be manufactured with smaller form factors to enable a manufacturer to decrease the overall size of the electronic device into which computing subsystem 100 will be placed. The decreased form factor and decreased power consumption of computing system 100 may enable electronic systems or devices, into which computing system 100 is placed, to be made smaller and run longer than devices employing traditional data strobe pair configurations.

Channel 2 may be configured to communicate data to memory 104b through a number of conductive terminals and conductive lines. Channel 2 may include a number of data terminals 130, a number of data strobe terminals 132, and number of data terminals 134, a number of data strobe terminals 136, and a number of data terminals 138. Memory 104b may include a number of data terminals 140, a number of data strobe terminals 142, and number of data terminals 144, a number of data strobe terminals 146, and a number of data terminals 148. Data terminals 130 may be communicatively coupled to data terminals 140 via data bus 150. Data bus 150 may be configured to carry signals for data lines 1-21D between memory controller 102 and memory 104b. Data strobe terminals 132 may be communicatively coupled to data strobe terminals 142 via data strobe bus 152. Data strobe bus 152 may be configured to carry differential data strobe signal pair 1S, 1S#. Data terminals 134 may be communicatively coupled to data terminals 144 via data bus 154. Data bus 154 may be configured to carry signals for data lines 22-43D between memory controller 102 and memory 104b. Data strobe terminals 136 may be communicatively coupled to data strobe terminals 146 via data strobe bus 156. Data strobe bus 156 may be configured to carry differential data strobe signal pair 2S, 2S#. Data terminals 138 may be communicatively coupled to data terminals 148 via data bus 158. Data bus 158 may be configured to carry signals for data lines 44-64D between memory controller 102 and memory 104b.

As described, each data strobe bus 152 and 156 may be interleaved between data buses 150, 154, and 158, according to various embodiments. According to other embodiments, data strobe buses 152 and 156 may positioned data buses that are grouped with more or less consecutive data lines. For example, data strobe bus 152 may be positioned between a first data bus having 10 data lines and a second data bus having 35 data lines. Other combinations are within the scope of the disclosure. Accordingly, the configuration of Channel 2 provides a variation of the configuration of Channel 1 while also providing the power savings benefits and real estate benefits described above in connection with Channel 1.

According to embodiments, DDR DRAM may be DDR2, DDR3, or other double data rate synchronous dynamic random access memory.

Figure 2:
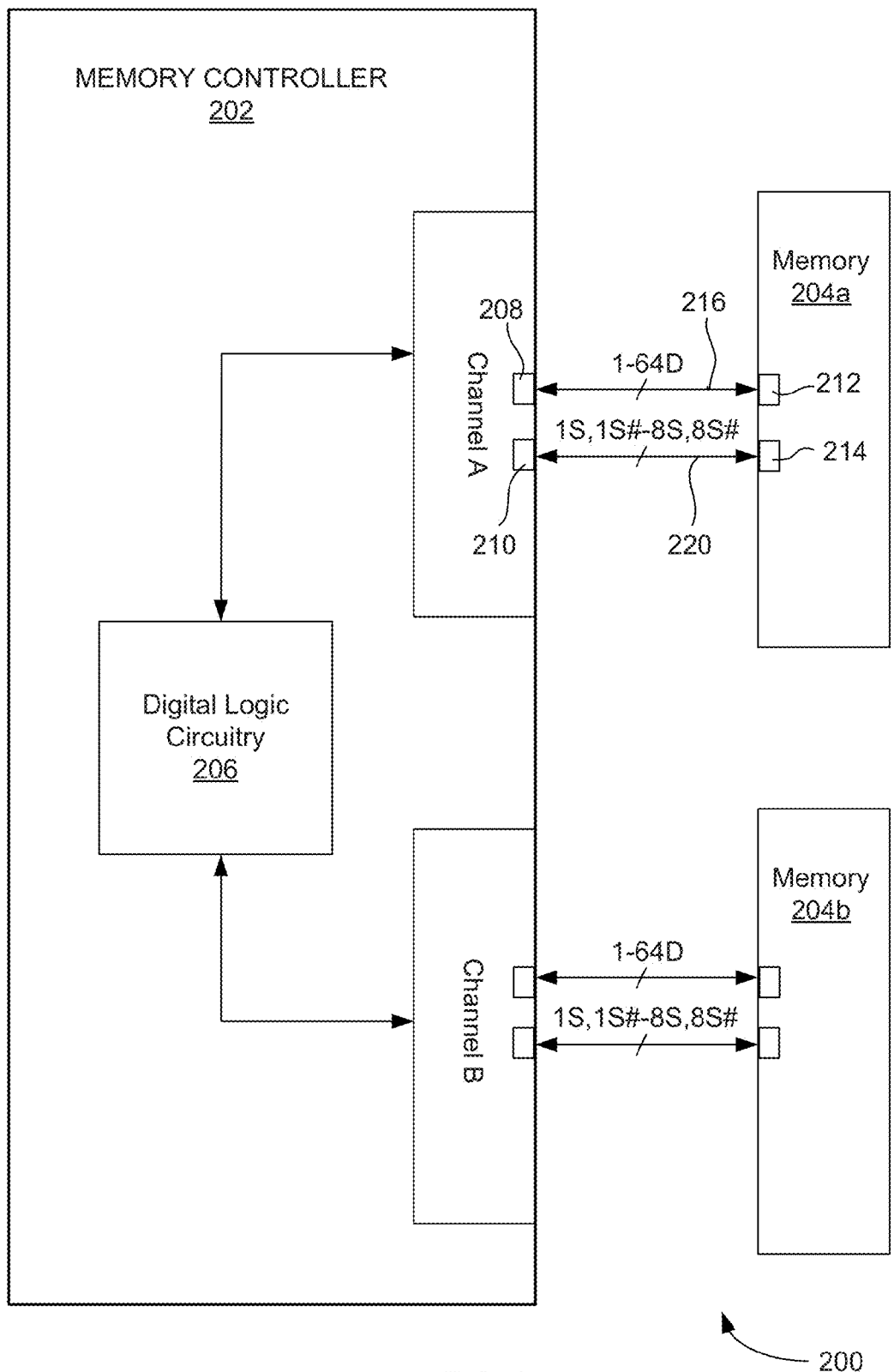
FIG. 2 describes a block diagram of a memory controller, according to various embodiments of the present disclosure.

FIG. 2 illustrates a computing system 200, according to various embodiments of the disclosure. Computing system 200 includes memory controller 202 communicatively coupled to memory 204a and memory 204b.

Memory controller 202 may be configured to selectively reduce the number of data strobe terminals used to transfer data between memory controller 202 and memory 204a and/or 204b. Memory controller 202 may include digital logic circuitry 206, a first communication channel Channel A, and a second communication channel Channel B.

Channel A may include a number of data terminals 208, and a number of data strobe terminals 210. Memory 204a may include a number of data terminals 212 and a number of data strobe terminals 214. Data terminals 208 may be communicatively coupled to data terminals 212 via data bus 216. Data bus 216 may be configured to carry signals for data lines 1-64D between memory controller 202 and memory 204a. Data strobe terminals 210 may be communicatively coupled to data strobe terminals 214 via data strobe bus 220. Data strobe bus 220 may be configured to carry 8 differential data strobe signal pairs 1S, 1S#-8S-8S#.

According to various embodiments, data strobe bus 220 may be disposed or positioned around a center of data bus 216, such that approximately 32 data line of data bus 216 are positioned on either side of data strobe bus 220. According to other embodiments, the data strobe lines of data strobe bus 220 may be interleaved between the data lines of data bus 216. In embodiments, data bus 216 may include 64 data lines. Alternatively, data bus 216 may include more or less than 64 data lines. While, data strobe bus 220 is described as including 8 pairs of data strobe lines, data strobe bus 220 may include more or less than 8 pairs of data strobe lines, according to various embodiments.

Channel B and memory 204b may be configured in a manner similar to the configuration described for Channel A.

Digital logic circuitry 206 may enable memory controller 202 to selectively reduce a number of strobe line pairs operated by memory controller 202 in order to reduce an amount of power consumed by computing system 200. In embodiments, memory controller 202 may receive instructions to enter a low power mode. In response to instructions to enter the low power mode, digital logic circuitry 206 may discontinue operation of one or more pairs of data strobe lines within data strobe bus 220. For example, in response to instructions to enter a low power mode, digital logic circuitry 206 may disable Channel A from using 6 of the 8 pairs of data strobe lines within data strobe bus 220. Alternatively, digital logic circuitry 206 may selectively disable Channel A from using 4 of the 8 pairs of data strobe lines within data strobe bus 220. Digital logic circuitry 206 may be configured to selectively increase and decrease the number of data strobe lines or terminals used by computing system 200 based on a power mode received by memory controller 202.

Figure 3:
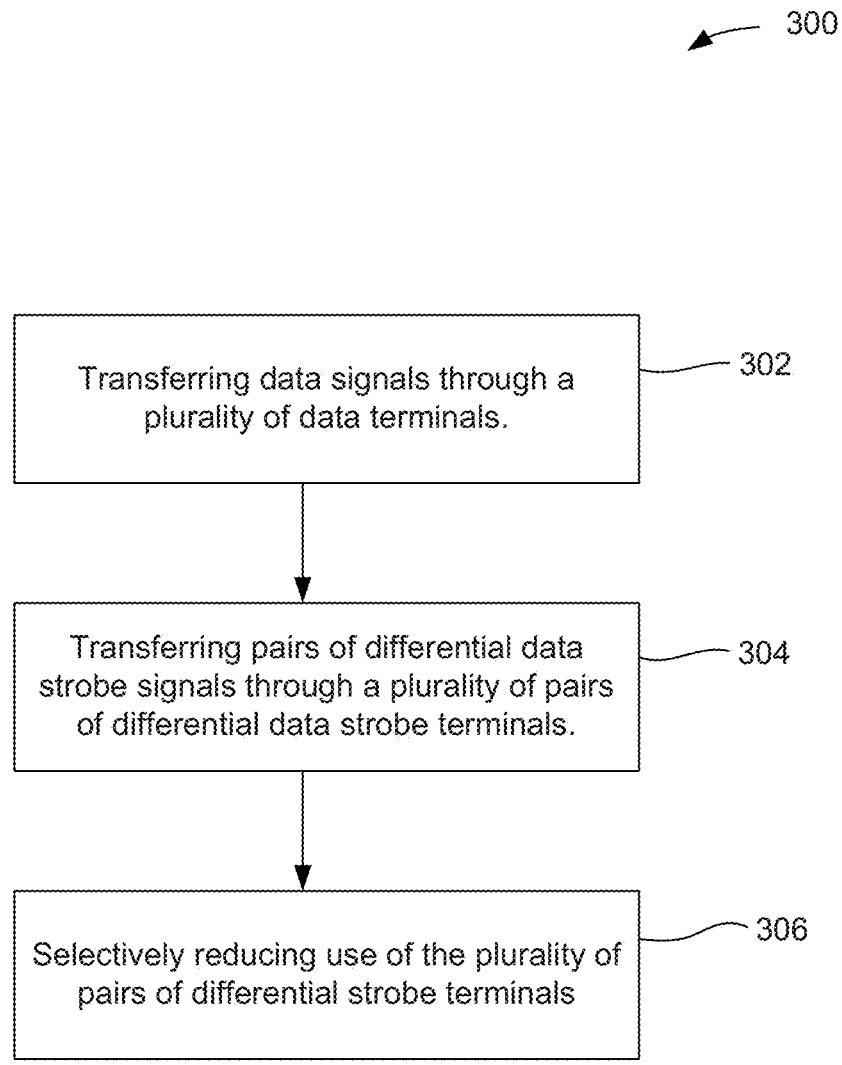
FIG. 3 describes a flow chart of an operation of the memory controller of FIG. 2, according to various embodiments of the present disclosure.

FIG. 3 illustrates an embodiment of a method 300 of operating a computing system 200.

At block 302, a memory controller transfers data signals through a plurality of data terminals. The memory controller may transfer the data signals to one or more memory devices. In embodiments, memory devices may be DDR DRAM devices. The plurality of data terminals may be associated with a single channel of the memory controller. The plurality of data terminals may include 64 or more data terminals associated with the channel.

At block 304, the memory controller may transfer pairs of differential data strobe signals through a plurality of pairs of differential data strobe terminals. The memory controller may transfer the differential data strobe signals to and from one or more memory devices. In embodiments, the memory controller may include 2 or more pairs of data strobe terminals. In one embodiment, the memory controller may include 8 pairs a data stroke terminals.

At block 306, the memory controller may selectively reduce use of the plurality of pairs of differential strobe terminals. For example, the controller may receive a command from a processor to enter a low-power mode. In response, the memory controller may disable use of one or more pairs of data strobe terminals to reduce power consumption by the memory controller and the one or more memory devices. According to one embodiment, none memory controller may be configured to transmit one or more instructions or signals to cause the one or more memory devices to enter a low power mode and to disable use of one or more data strobe terminals of the one or more memory devices.

Figure 4:
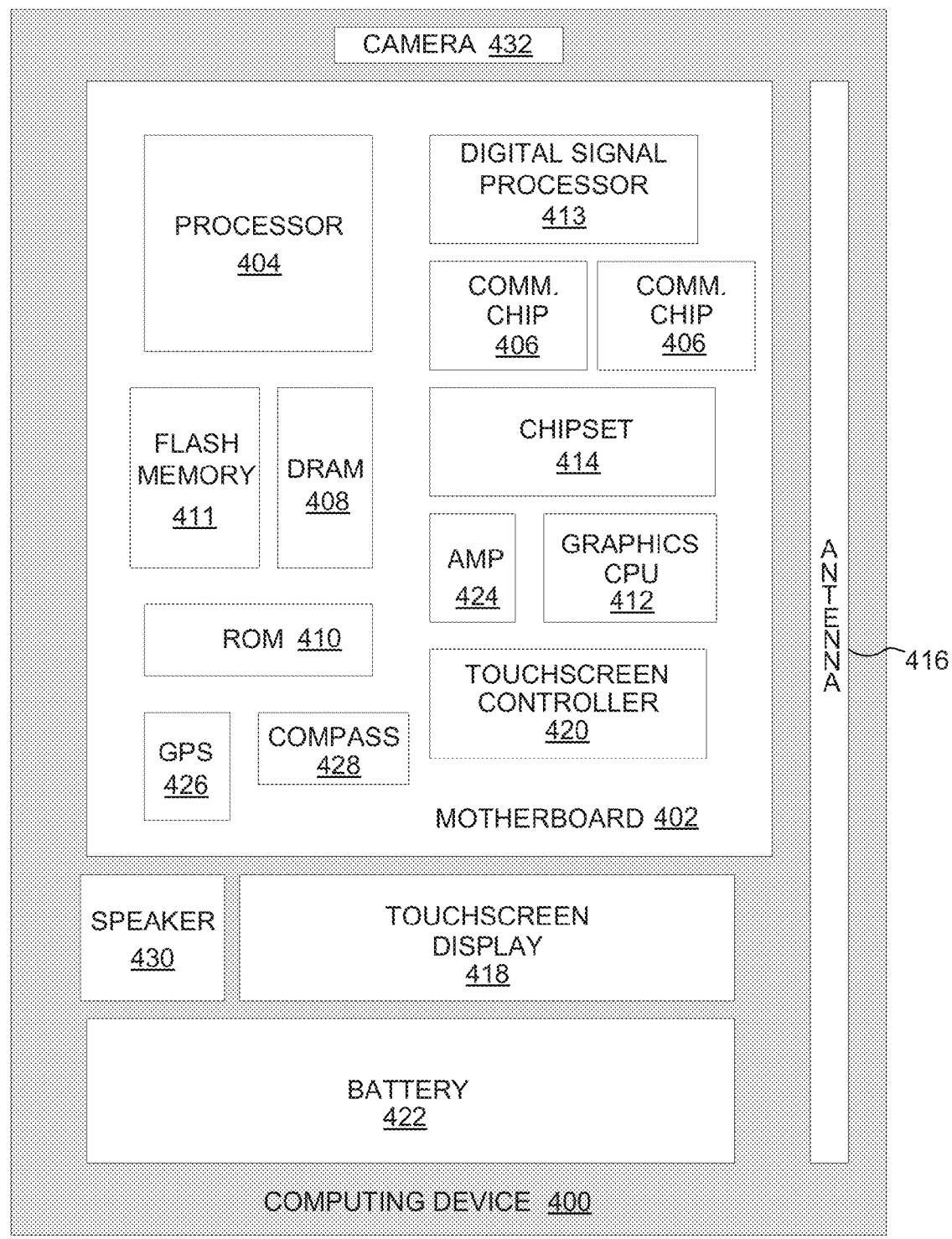
FIG. 4 describes a block diagram of an implementation of the memory controller of FIG. 1 or FIG. 2, according to various embodiments of the present disclosure.

FIG. 4 illustrates a computing device 400 in accordance with one implementation of an embodiment of the invention. The computing device 400 houses a board 402. The board 402 may include a number of components, including but not limited to a processor 404 and at least one communication chip 406. The processor 404 may be physically and electrically coupled to the board 402. In some implementations the at least one communication chip 406 may also be physically and electrically coupled to the board 402. In further implementations, the communication chip 406 may be part of the processor 404.

Depending on its applications, computing device 400 may include other components that may or may not be physically and electrically coupled to the board 402. These other components include, but are not limited to, volatile memory (e.g., DRAM 408), non-volatile memory (e.g., ROM 410), flash memory 411, a graphics processor 412, a digital signal processor 413, a crypto processor, a chipset 414, an antenna 416, a display, a touchscreen display 418, a touchscreen controller 420, a battery 422, an audio codec, a video codec, a power amplifier 424, a global positioning system (GPS) device 426, a compass 428, an accelerometer, a gyroscope, a speaker 430, a camera 432, and a mass storage device (such as hard disk drive, compact disk (CD), digital versatile disk (DVD), and so forth).

According to various embodiments, chipset 414 may include memory controller 102 or 202. According to embodiments, DRAM 408 may be memory 104 or 204.

The communication chip 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the disclosure, the integrated circuit die of the processor includes one or more devices, such as memory controller 102 or 202 operably configured according to embodiments of the disclosure. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406.

In further implementations, another component housed within the computing device 400 may contain an integrated circuit die that includes one or more devices, such as processor cores, cache and one or more memory controllers.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

According to various embodiments, an apparatus may include a number of data terminals, wherein the number of data terminals may include at least 64 bi-directional data terminals; no more than two pairs of differential data strobe terminals associated with the number of data terminals and configured to transfer data strobe signals; and digital logic circuitry coupled to the data terminals and configured to use the no more than two pairs of differential data strobe terminals concurrently with the number of data terminals to transfer data. The no more than two pairs of differential data strobe terminals may consist of one pair of differential data strobe terminals. The no more than two pairs of differential data strobe terminals may be positioned on the apparatus to facilitate routing data strobe lines, coupled to the two or less pairs of differential data strobe terminals, near a center of a data bus coupled to the number of data terminals. The apparatus may be either a dynamic random access memory (DRAM) device or a memory controller. The DRAM device may be a type of double data rate (DDR) DRAM device. The memory controller may be an integrated portion of a computer processor.

According to various embodiments, memory controller may include a number of data terminals, wherein the number of data terminals are bi-directional; a number of pairs of differential data strobe terminals associated with the number of data terminals and configured to transfer data strobe signals; and digital logic circuitry coupled to the number of data terminals and configured to use the number of pairs of differential data strobe terminals concurrently with the number of data terminals to transfer data, the digital logic circuitry further configured to reduce power consumed by the memory controller by selectively reducing use of the number of pairs of differential data strobe terminals to transfer data to a number of the number of pairs of differential data strobe terminals that is less than all of the number of pairs of differential data strobe terminals. The digital logic circuitry may be configured to selectively reduce use of the number of pairs of differential data strobe terminals, based on a power mode of the memory controller.

According to embodiments, the number of bi-directional data terminals may include at least 64 bi-directional data terminals. The number of pairs of differential data strobe terminals may include at least 8 pairs of differential data strobe terminals. The number that is less than all of the number of pairs may be 2 pairs of differential strobe terminals. The memory controller may be an integrated portion of a computer processor. The data strobe terminals are configured to enable transfer of the data between the memory controller and double data rate synchronous dynamic ram (DDR SDRAM).

According to various embodiments, a system may include a printed circuit board; one or more processors coupled to the printed circuit board; a memory interface coupled to the printed circuit board and configured to receive one or more synchronous dynamic random access memory (SDRAM) devices; and a number of data traces disposed on the printed circuit board between the one or more processors and the memory interface. The number of traces may be configured to electrically couple data terminals of the one or more processors with data terminals of the memory interface. The number of data traces may include at least 64 data traces. The system may include a number of data strobe traces disposed on the printed circuit board and configured to electrically couple the one or more processors to the memory interface. The number of data strobe traces may include no more than 4 data strobe traces for every 64 data traces. The system may include a network interface configured to communicatively couple the system with a network.

According to embodiments, the number of data traces may be disposed on the printed circuit board in parallel as a data bus. The number of data traces may be disposed in parallel to the number of data traces and near a center of the data bus. Each of the no more than 4 data strobe traces may be separated by at least one of the number of data traces. The one or more processors may include a stand-alone memory controller.

According to embodiments, The one or more processors may include a memory controller integrated into a computer processor operable to execute a software operating system.

In embodiments, the system may be a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder. The system may further include a display device operatively coupled with the one or more processors. The display device may be a touch screen.

According to various embodiments, a method may include transferring data signals, with a memory controller, through a number of data terminals, wherein the data terminals include at least 64 data terminals. The method may include transferring pairs of differential data strobe signals, with the memory controller, through a number of pairs of differential data strobe terminals. The method may include reducing a power consumption of the memory controller by selectively reducing use of the number of pairs of differential data strobe terminals to a number of the number of pairs that is less than all of the number of pairs to transfer data.

The method may further include determining a power mode of the memory controller. Reducing the power consumption may include reducing the use of the number of pairs of differential data strobe terminals based on the power mode. The number of the number of pairs may be one pair or two pairs of data strobe terminals. The memory controller may be an integrated portion of a computer processor.

The above description of illustrated implementations of the disclosure, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Specific features of any of the above described embodiments may be fully or partially combined with one or more other embodiments, either wholly or partially, to form new embodiments of the disclosure.

What is claimed is:

1. An apparatus, comprising:
    a plurality of data terminals, wherein the plurality of data terminals includes at least 64 bi-directional data terminals;
    no more than two pairs of differential data strobe terminals associated with the plurality of data terminals and configured to transfer data strobe signals; and
    digital logic circuitry coupled to the data terminals and configured to use the no more than two pairs of differential data strobe terminals concurrently with the plurality of data terminals to transfer data.

2. The apparatus of claim 1, wherein the no more than two pairs of differential data strobe terminals consists of one pair of differential data strobe terminals.

3. The apparatus of claim 1, wherein the no more than two pairs of differential data strobe terminals are positioned on the apparatus to facilitate routing data strobe lines, coupled to the two or less pairs of differential data strobe terminals, near a center of a data bus coupled to the plurality of data terminals.

4. The apparatus of claim 1, wherein the apparatus is either a dynamic random access memory (DRAM) device or a memory controller.

5. The apparatus of claim 4, wherein the DRAM device is a type of double data rate (DDR) DRAM device.

6. The apparatus of claim 4, wherein the memory controller is an integrated portion of a computer processor.

7. A memory controller, comprising:
    a plurality of data terminals, wherein the plurality of data terminals are bi-directional;
    a plurality of pairs of differential data strobe terminals associated with the plurality of data terminals and configured to transfer data strobe signals; and
    digital logic circuitry coupled to the plurality of data terminals and configured to use the plurality of pairs of differential data strobe terminals concurrently with the plurality of data terminals to transfer data, the digital logic circuitry further configured to reduce power consumed by the memory controller by selectively reducing use of the plurality of pairs of differential data strobe terminals to transfer data to a number of the plurality of pairs of differential data strobe terminals that is less than all of the plurality of pairs of differential data strobe terminals;

wherein the plurality of bi-directional data terminals includes at least 64 bi-directional terminals, and wherein the number that is less than all of the plurality of pairs is 2 pairs of differential strobe terminals.

8. The memory controller of claim 7, wherein the digital logic circuitry is configured to selectively reduce use of the plurality of pairs of differential data strobe terminals, based on a power mode of the memory controller.

9. The memory controller of claim 7, wherein the plurality of pairs of differential data strobe terminals includes at least 8 pairs of differential data strobe terminals.

10. The memory controller of claim 7, wherein the memory controller is an integrated portion of a computer processor.

11. The memory controller of claim 7, wherein the data strobe terminals are configured to enable transfer of the data between the memory controller and double data rate synchronous dynamic ram (DDR SDRAM).

12. A system comprising:
a printed circuit board;
one or more processors coupled to the printed circuit board;
a memory interface coupled to the printed circuit board and configured to receive one or more synchronous dynamic random access memory (SDRAM) devices;
a plurality of data traces disposed on the printed circuit board between the one or more processors and the memory interface, the plurality of traces configured to electrically couple data terminals of the one or more processors with data terminals of the memory interface, wherein the plurality of data traces include at least 64 data traces;
a plurality of data strobe traces disposed on the printed circuit board and configured to electrically couple the one or more processors to the memory interface, wherein the plurality of data strobe traces include no more than 4 data strobe traces for every 64 data traces; and
a network interface configured to communicatively couple the system with a network.

13. The system of claim 12, wherein the plurality of data traces are disposed on the printed circuit board in parallel as a data bus, wherein the plurality of data traces are disposed in parallel to the plurality of data traces and near a center of the data bus.

14. The system of claim 12, wherein each of the no more than 4 data strobe traces are separated by at least one of the plurality of data traces.

15. The system of claim 12, wherein the one or more processors includes a stand-alone memory controller.

16. The system of claim 12, wherein the one or more processors includes a memory controller integrated into a computer processor operable to execute a software operating system.

17. The system of claim 12, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video reorder.

18. The system of claim 17, further comprising a display device operatively coupled with the one or more processors.

19. The system of claim 18, wherein the display device is a touch screen.

20. A method, comprising:
transferring data signals, with a memory controller, through a plurality of data terminals, wherein the data terminals include at least 64 data terminals;
transferring pairs of differential data strobe signals, with the memory controller, through a plurality of pairs of differential data strobe terminals; and
reducing a power consumption of the memory controller by selectively reducing use of the plurality of pairs of differential data strobe terminals to a number of the plurality of pairs that is less than all of the plurality of pairs to transfer data;
wherein the number of the plurality of pairs is one pair or two pairs of data strobe terminals for every 64 bi-directional terminals.

21. The method of claim 20, further comprising:
determining a power mode of the memory controller, wherein reducing the power consumption includes reducing use of the plurality of pairs of differential data strobe terminals based on the power mode.

22. The method of claim 20, wherein the memory controller is an integrated portion of a computer processor.

* * * * *